United States Patent [19]

Van Roermund

[11] 4,266,146
[45] May 5, 1981

[54] CHARGE TRANSFER DEVICES HAVING SWITCHABLE BLOCKING ELECTRODES

[75] Inventor: Arthur H. M. Van Roermund, Eindhoven, Netherlands

[73] Assignee: U.S. Philips Corporation, New York, N.Y.

[21] Appl. No.: 948,281

[22] Filed: Oct. 3, 1978

[30] Foreign Application Priority Data

Oct. 13, 1977 [NL] Netherlands .................... 7711228
Feb. 3, 1978 [NL] Netherlands .................... 7801242

[51] Int. Cl.³ ...................... G11C 19/28; H01L 29/78
[52] U.S. Cl. ................................ 307/221 D; 357/24
[58] Field of Search ................ 357/24; 307/221 D

[56] References Cited

U.S. PATENT DOCUMENTS

| | | | |
|---|---|---|---|
| 3,876,952 | 4/1975 | Weimer | 357/24 |
| 3,913,077 | 10/1975 | Erb | 307/221 D |
| 3,919,468 | 11/1975 | Weimer | 357/24 |
| 3,931,463 | 1/1976 | Levine | 357/24 |
| 4,031,315 | 6/1977 | Pfleiderer | 357/24 |
| 4,145,676 | 3/1979 | Benoit-Gonin | 307/221 D |

OTHER PUBLICATIONS

Berger et al., "Cancellation of Aliasing in a CCD Low-Pass Filter", 3rd Int. Conf. Technol. and Applications Charge Coupled Devices, Edinburgh (9/76), pp. 302-308.

Primary Examiner—Gene M. Munson
Attorney, Agent, or Firm—Thomas A. Briody; Robert T. Mayer; James J. Cannon, Jr.

[57] ABSTRACT

A charge transfer device having one or more control electrodes connected to switching means so that the electrode can perform two functions. Normally the electrode is used for charge transfer but it may be switched to act as a blocking electrode for blocking the charge present underneath it for one or more clock phases. This permits the device to be formed as a filter, an analog-to-digital converter or digital-to-analog converter in a simple and inexpensive manner. The charge transfer channel may be split into sections using isolation diffusions.

4 Claims, 21 Drawing Figures

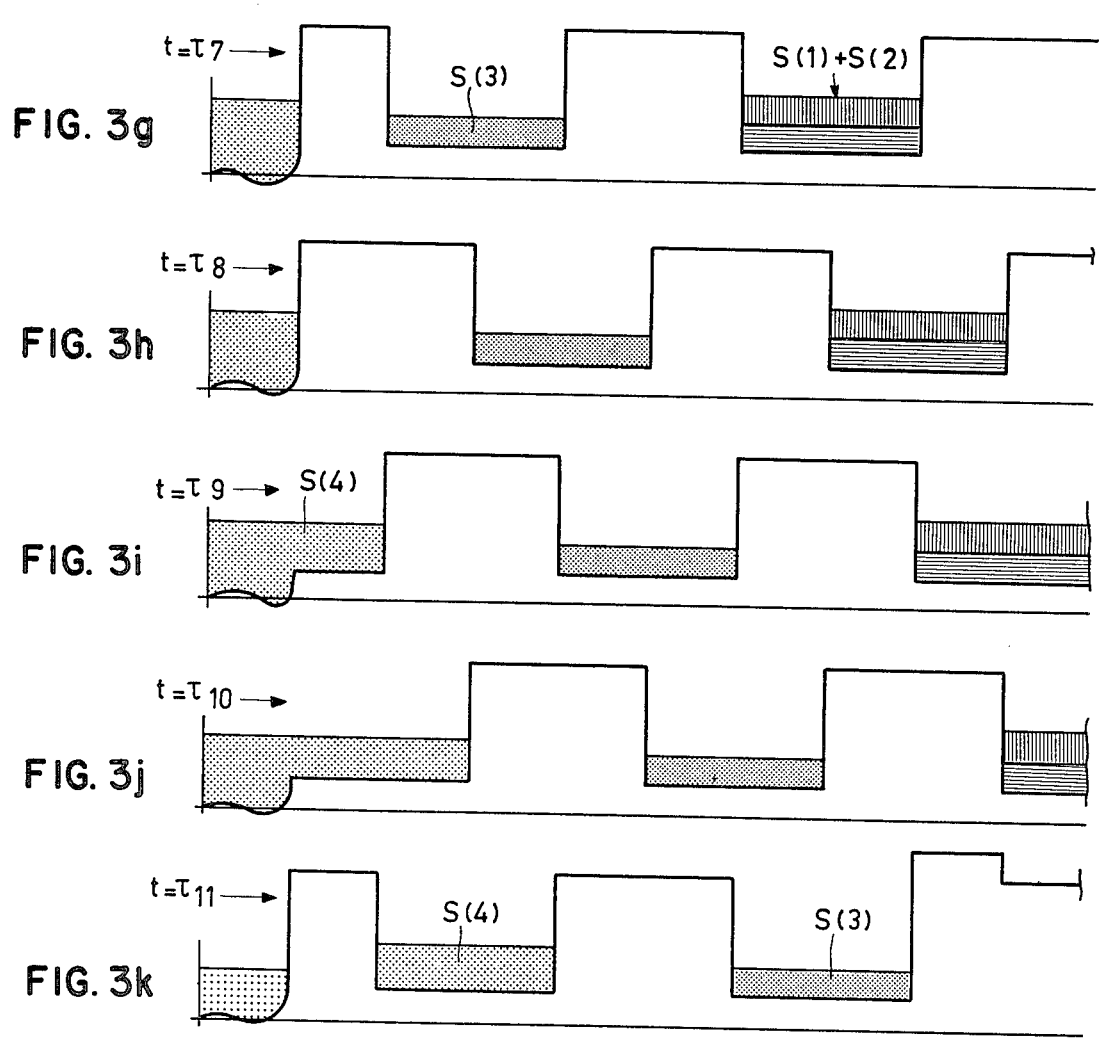

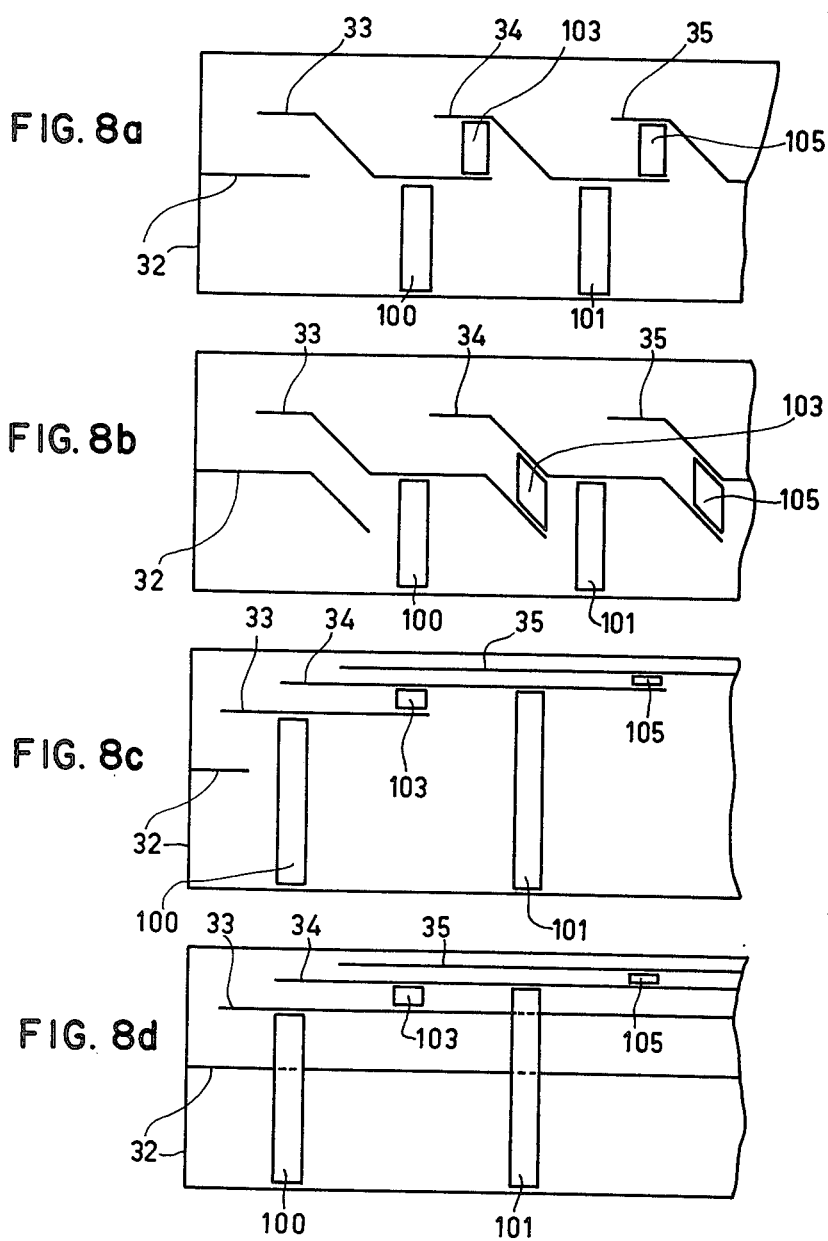

CHARGE TRANSFER DEVICES HAVING SWITCHABLE BLOCKING ELECTRODES

BACKGROUND OF THE INVENTION

1. Field of the Invention

This invention relates to charge transfer devices, particularly but not exclusively for use as filters, analog to digital converters, or digital to analog converters.

2. Description of the Prior Art

From "Digest of Technical Papers of the Technology and Applications of Charge-Coupled Devices", University of Edinburgh, September 1976, page 308, FIG. 7, a charge transfer device is known comprising a semiconductor layer of one conductivity type, write means for permitting information in the form of packets of charge to be locally introduced into the semiconductor layer, read means for permitting said information to be read at another location in the layer and control electrodes at least on one side of the layer for permitting electric fields to be capacitively generated in the semiconductor layer with the aid of multiphase clock signals, by means of which fields the charge packets can be transferred to the read means along a channel in the layer in a direction parallel to the layer.

In this known charge transfer device the write means are constituted by two input diffusions, three control electrodes and one isolation diffusion. The isolation diffusion is disposed in the direction of transfer of the charge packets and divides the transfer channel at the input of the charge transfer device into two sections. Each transfer section includes an input diffusion. These two diffusions are jointly connected to a source of reference voltage. Above each of the two transfer sections there is arranged a first control electrode. Different clock signals are applied to the two first control electrodes. Subsequently, a common second control electrode is arranged over the two transfer sections, to which the input signal to be processed is applied. Subsequently, after the write means a third and a fourth control electrode are arranged adjacent each other above the one transfer section, while opposite these two control electrodes a fifth control electrode is arranged above the other channel. The surface area of this fifth control electrode is substantially equal to the sum of the surface areas of the third and the fourth control electrodes. After the last-mentioned control electrodes the isolation diffusion ceases and the transfer channel is no longer split into two sections. Above the further channel there are arranged control electrodes, which are split or non-split, the first control electrode constituting the summing electrode.

The fact that above the one channel section there are arranged a third and a fourth control electrode, while above the corresponding other channel section there is arranged only one control electrode, results in the signal being transferred in two steps in the one channel section, while the signal is conveyed in one step in the other channel section. This means that the signal in the one channel section is delayed relative to the signal in the other channel section. After the control electrode the isolation diffusion ceases and so also does the channel division. Underneath the summing electrode the signals from the two channel sections are added to each other. For a correct charge transfer underneath the summing electrode it is necessary that the clock phase of the clock signals which are applied to the control electrodes which precede the summing electrode in the two channel sections are identical. As the number of steps of the charge transfer for the summing electrode in the two channel sections is different, it is necessary that the sampling instants at the input of the two channel sections are selected differently. In the present example this is realized by the application of clock signals which are shifted 180° in phase relative to each other. Thus, underneath the summing electrode the sum obtained is of two signals, one of which is delayed relative to the other. The circuit operates in fact as a forward filter, as for example shown in FIG. 1 on page 306 of the cited literature. In the aforementioned example the transfer channel is divided into two sections, the signal in the one section being transferred in one more step. If a sharper input filter is required, the transfer channel is split into several sub-channels at the beginning of the charge transfer device, which sub-channels all have a different delay relative to each other for the signal in the relevant sub-channel. Examples of this are given in FIGS. 8 and 9 on page 308 of the cited literature.

In the cited reference forward filtration is always employed at the input of the charge transfer device. However, in principle, it is also possible to apply the filtration not at the input but further on in the charge transfer device. However, the only condition is then that the delays in the channel sections amount to an integral number of clock periods, because otherwise the signals in the various channel sections do not arrive at the summing electrode with the correct clock phase.

A disadvantage of the method of signal processing described is that the described method only allows time-invariant processing of the input signal and furthermore that in the case of operation as a filter the transfer function of the filter is non-variable. This is because this function is entirely determined by the selected geometry of the section of the charge transfer device belonging to the filter. It is as though the transfer function is "built in" by the choice of the said geometry.

A further drawback is that the areas of the control electrode are selected differently so as to realize the required filter function. As a result of this, the signal transfer underneath the widened control electrodes takes place more slowly than underneath the non-widened control electrodes, namely more slowly according as the relevant control electrode is further widened. This means that the maximum attainable transfer speed of the charge transfer device is drastically reduced and decreases further when wider control electrodes are used.

Another disadvantage is that the large variety in control electrode areas complicates manufacture of the known charge transfer device. Moreover, the application of contact conductors between the various control electrodes and the associated clock conductors becomes more difficult as the areas of the respective control electrodes differ more from each other.

SUMMARY OF THE INVENTION

According to the present invention a charge transfer device is characterized in that at least one blocking electrode is formed by at least one of its control electrodes or a part thereof being connected to switching means for permitting the application of a voltage which at one time is equal to a phase of the clock signal which together with the clock signals on the adjacent control electrodes ensures that transfer of a charge packet in the channel underneath the said control electrode and at another time equals a blocking voltage which prevents the transfer of a charge packet in the channel underneath said control electrode.

One particular form of such a device in accordance with the invention is also characterized in that at least one sensing element is arranged in front of the blocking electrode and is associated with the same channel as said blocking electrode, which sensing element is connected to a detector connected directly or indirectly to a comparator for comparing the magnitude of the signal appearing at the output of the detector with a reference signal, the output signal of the comparator being applied to a control-input of said switching means either via or not via delay elements.

BRIEF DESCRIPTION OF THE DRAWINGS

Embodiments of the invention will be described, by way of example, with reference to the accompanying diagrammatic drawings, in which:

FIGS. 3a to 3k are diagrams to illustrate the operation of the device;

DESCRIPTION OF THE PREFERRED EMBODIMENTS

Figure 1:
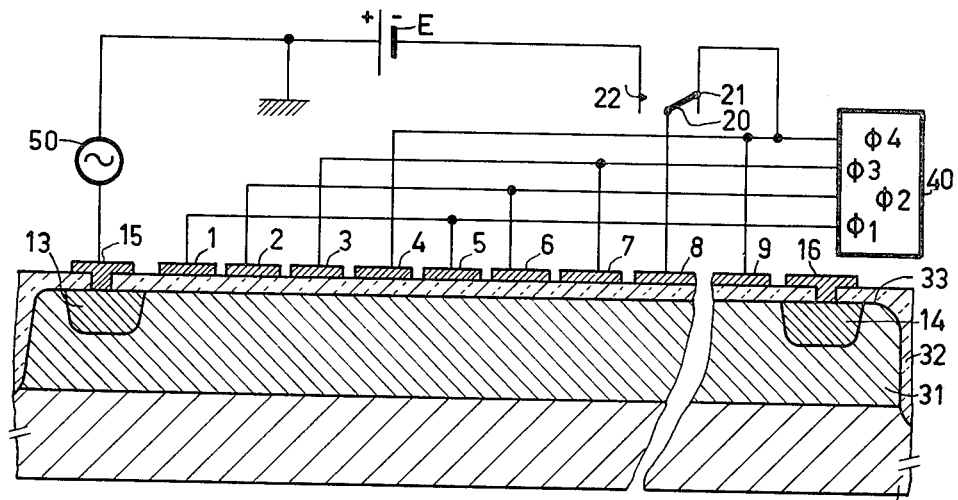
FIG. 1 shows a cross-sectional view a charge transfer device in accordance with the invention.

The charge transfer device of FIG. 1 comprises a semi-conductor body 30 with a semiconductor layer 31 of n-type silicon. On said semiconductor layer, at least on the side 33 of said layer, control electrodes 1,2,3,4,5,6,7,8,9 are shown for the application of clock voltages. The interruption between the control electrodes 8 and 9 indicates that more control electrodes than those shown are possible. To the control electrodes multiphase clock signals are applied in operation of the device to capacitively generate electric fields in the semiconductor layer 31. The control electrodes 1 and 5 are jointly connected to that output of a switching voltage source 40, to which the clock signal of phase $\phi_1$ is applied, see FIG. 2. The control electrodes 2 and 6 are jointly connected to that output of the switching voltage source 40, to which the clock signal of phase $\phi_2$ is applied, see FIG. 2. The control electrodes 3 and 7 are connected to that output of the switching voltage source 40, to which the clock signal of phase $\phi_3$ is applied, see FIG. 2. The control electrodes 4 and 9 are connected to that output of the switching voltage source 40, to which the clock signal of phase $\phi_4$ is applied.

The control electrode 8 is a so-called blocking electrode. This electrode is connected to switching means, constituted by the change-over switch 20. Contact 22 of this change-over switch is connected to the negative terminal of a direct voltage source E, whose other terminal is connected to a point at ground potential. Contact 21 of the change-over switch is connected to that output of the switching voltage source 40, to which the clock signal of the phase $\phi_4$ is applied.

In the semiconductor layer 31 an input diffusion 13 is provided, which is connected to a signal voltage source 50 by a wire conductor 15. A blocking layer 32 is constituted by an insulating layer of silicon dioxide. In said semiconductor layer 31 there is also provided an output diffusion 14, which is connected to a read-out conductor 16. The input diffusion 13 and the write conductor 15 form part of the write means of the charge transfer device together with the first control electrodes and permit information in the form of packets of charge to be locally introduced into the layer 31. The output diffusion 14 and the read-out conductor 16 together constitute the read means and permit the information to be read at another location in the layer 31.

The thickness and doping concentration of the semiconductor layer (31) are for example 5 $\mu$m and $10^{15}$ atoms/cm$^3$. Said thickness and doping concentration are so small that there can be set up in layer 31, transversely thereto, an electric field having such strength that a depletion zone is formed over the entire thickness of the layer without the occurrence of avalanche multiplication. The charge transfer device shown in FIG. 1 is of the bulk-channel type as for example described in U.S. Patent Application 866,004 filed Dec. 30, 1977. In this semiconductor device the transfer of electric charge is effected mainly via the interior of the semiconductor layer. During operation the information in the form of a packet of majority charge carriers can be stored in a region of the semiconductor layer opposite one or more of the control electrodes and can be separated from other charge packets by means of electric fields in the depletion zones which enclose said region and which extend transversely over the semiconductor layer. During charge transfer the charge carriers of said charge packets are transferred from the above-mentioned region of the semiconductor layer to a subsequent region of the semiconductor layer by applying a voltage difference between the appropriate electrodes, the charge carriers flowing from the first mentioned region to the next region substantially through the interior of the semiconductor layer, until the first mentioned region of the semiconductor layer is depleted. The doping concentration and the thickness of the semiconductor layer should then obviously be so small that the semiconductor layer can be depleted over its entire thickness without the occurrence of avalanche multiplication. Such a low-doped layer may for example be constituted by a homogeneously doped high-ohmic epitaxial layer which is disposed on a base or substrate of the opposite conductivity type, as is also indicated in the afore-mentioned U.S. Patent Application.

Figure 2:
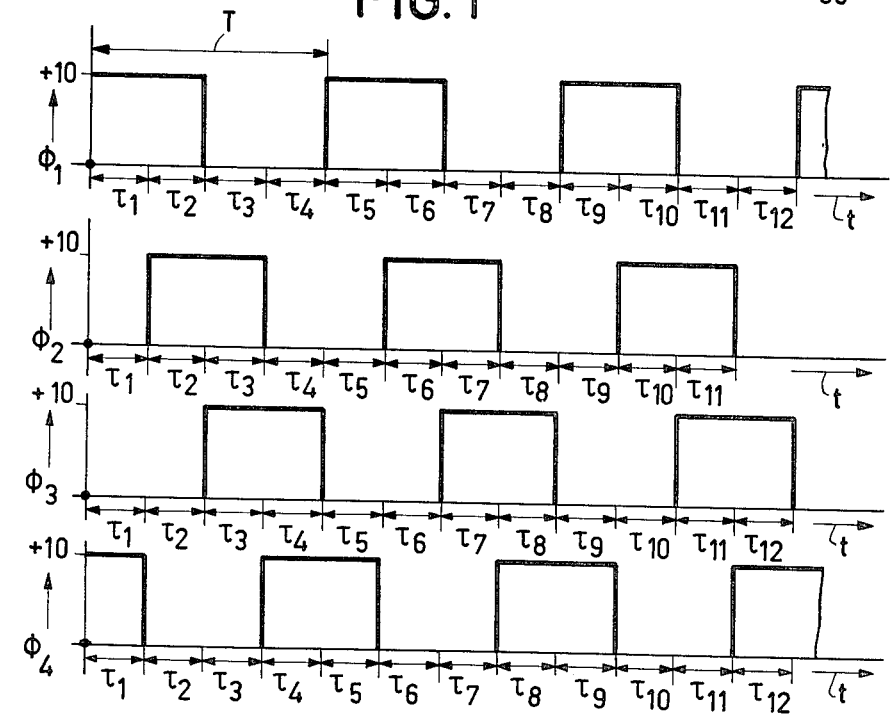
FIG. 2 shows the variation with time of the clock voltages $\phi_1$ $\phi_2$ $\phi_3$ and $\phi_4$ which are applied to the device of FIG. 1 and an example of the voltage $\phi_8$ on the control electrode 8.
Figure 3A:
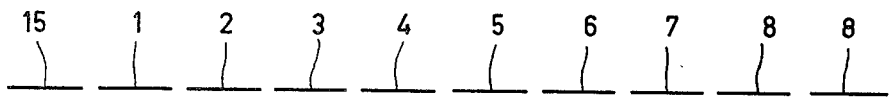
Figure 3B:
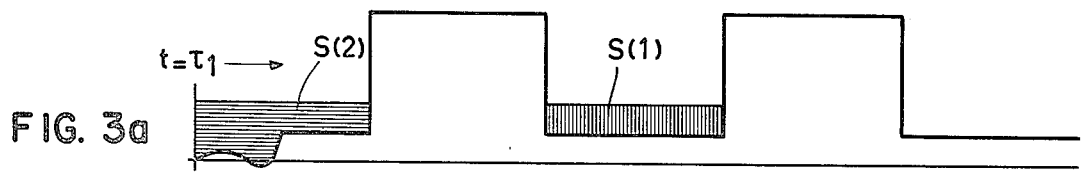
Figure 3C:
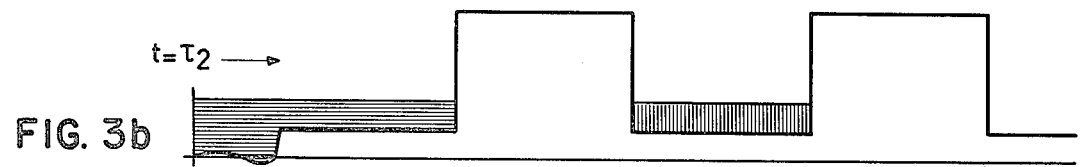
Figure 3D:
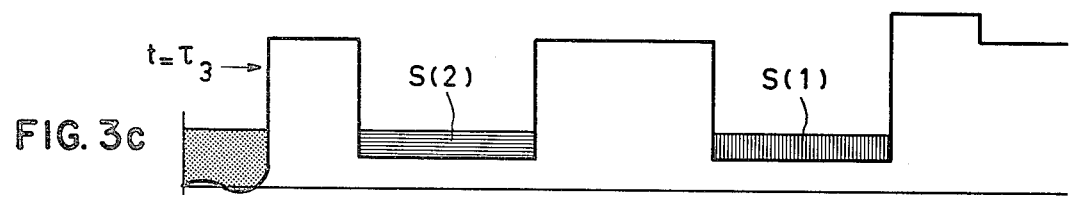
Figure 3E:
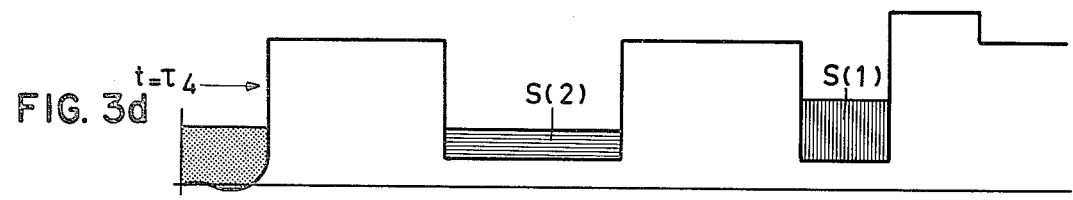
Figure 3F:
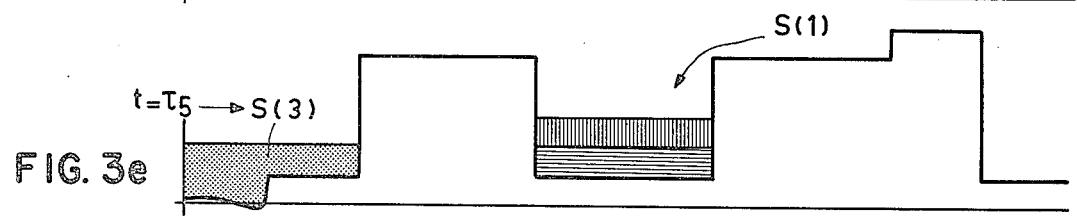

FIGS. 3a through 3k schematically show how a charge packet is formed, how it is transferred and how blocking and summation thereof is effected. In the time interval $\tau_1$ the voltage on the control electrodes 1,4,5 and 8 and the next control electrode 8' is +10 volts and the voltage on the electrodes 2,3,6 and 7 is 0 v dt, see FIG. 2. As a result, potential wells are produced underneath the electrodes 1, (4 and 5) and (8 and 8'), as is shown in FIG. 3a. In the potential well underneath the control electrodes 4 and 5 a charge packet S(1) is present. Underneath the input diffusion 15 a continuous potential well is present which is several times deeper than the other potential wells in the charge transfer device. In FIGS. 3a through 3k this is symbolically represented by a curved line at the bottom of the potential well underneath the input diffusion 15. At the input a second charge packet S(2) is formed with the aid of the input diffusion 15 and the first control electrodes. In the time interval $\tau_2$ the voltage on the control electrodes 1,2,5,6 and 8' is +10 volts and the voltage on the control electrodes 3,4,7 and 8 is 0 volts. As a result of this, potential wells are formed underneath the control electrodes (1 and 2), (5 and 6), and 8', as is indicated in FIG. 3b. The charge packet S(1) is thus shifted by one position in the direction of transfer. FIG. 3c shows how the charge packet S(1) is shifted as far as the blocking electrode 8, which in the relevant time interval $\tau_3$ has a voltage which is $-E$ volts. In the next time intervals $\tau_4$, $\tau_5$, $\tau_6$ the electrode 8 remains blocked. No charge transfer takes place from the region underneath the control electrode 7 to the region underneath the control electrode 8' in said time intervals. It is evident from FIGS. 3d and 3e how the two charge packets S (1) and S (2) are added to each other with the aid of the blocking electrode 8. In the time interval $\tau_7$ the sum of the charge packets S (1)+S (2) has arrived at the control electrode 8 and the blocking voltage is removed from the control electrode 8. FIGS. 3h and 3e show how the sum of the charge packets S (1) and S (2) is transferred to the right with the aid of the control electrodes 7, 8 and 8'. In the time interval $\tau_{11}$ the control electrode 8 is again connected to the blocking voltage $-E$ and the control electrode 8 again functions as a blocking electrode in this and subsequent time intervals $\tau_{11}$, $\tau_{12}$, $\tau_{13}$ and $\tau_{14}$, see FIG. 2. In these time intervals the charge packets S (3) and S (4) are added to each other as described previously for the charge packets S (1) and S (2), see FIGS. 3e and 3f.

From the above description of the operation of this charge transfer device in accordance with the invention it can be seen that when the blocking voltage and one clock pulse of the phase $\phi_4$ are alternately applied to the control electrode 8 with the aid of switch 20, two charge packets are always added to each other. It will be evident that, by blocking two clock pulses, the sum of three charge packets can be obtained. In general, the following relationship is valid $$F(T) = \sum_{k=0}^{M} S(\tau - k.T) \quad (1)$$

where T is the clock period of the original clock pulses $\phi_4$, which are applied to the control electrode; M is the number of clock pulses blocked with the aid of the blocking voltage. In other words, the clock frequency of the clock pulses $\phi_8$ is (M+T). In FIG. 2, M=1. For this switching method the charge transfer device of FIG. 1 operates as a forward filter, charge packets which are delayed relative to each other being fully added to each other. If it is desirable that only fractions of charge packets are added to each other, this can be realized with the aid of an isolation diffusion as shown in FIG. 4.

Figure 4:
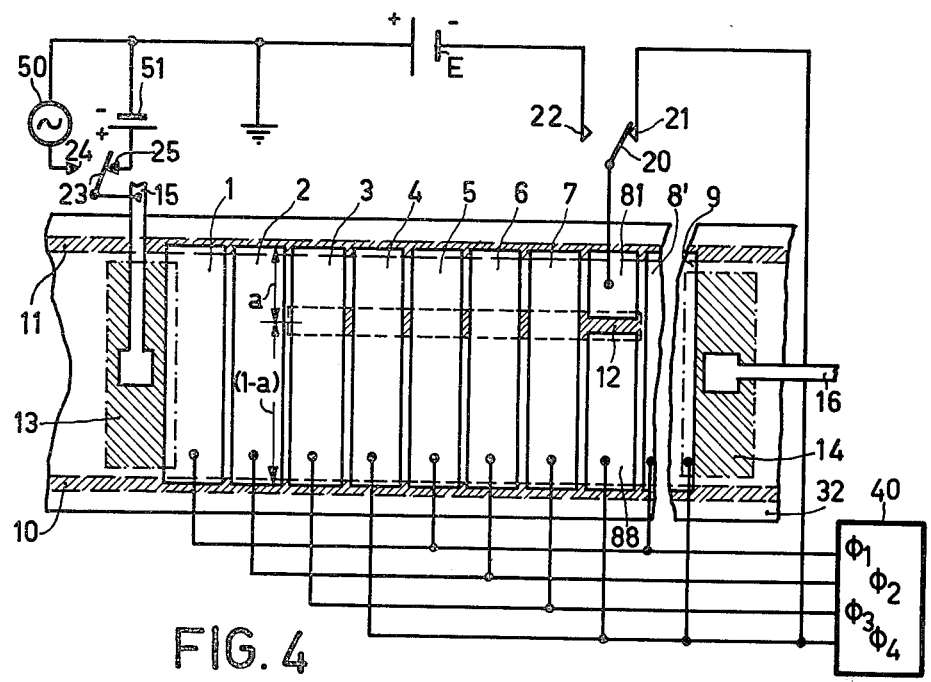
FIG. 4 shows in plan view another charge transfer device in accordance with the invention.

In the charge transfer device of FIG. 4 an isolation diffusion 12 is situated underneath the control electrodes 3,4,5,6 and 7, and continues as far as the control electrode 8'. The original control electrode 8 is now divided into two halves 81 and 88, which partly overlap the isolation diffusion 12. The section 81 is connected to the change-over switch 20 and the section 88 is connected to that output of the switching voltage source 40 to which the clock phase $\phi_4$ is applied. Owing to the isolation diffusion 12 the transfer channel underneath the control electrodes 3,4,5,6,7 81 and 88 is divided into two halves a and (1-a). In the half (1-a) charge transfer is effected normally, because the control electrode 88 is permanently connected to a clock conductor. In the half a the blocking electrode 81 is disposed. Charge transfer through this channel section is effected in the same way as described with reference to FIG. 1. The change-over switches 20 and 23 are operated synchronously. Point 25 is kept sufficiently positive with the aid of the direct voltage source 51, so that no charge is injected at the input, if the input is connected to this point. The only difference is that now only a fraction a of the charge packet underneath the control electrode 2 is blocked during one clock pulse, while the remainder (1-a) is transferred normally. The output signal Y(t) now satisfies the following relationship:

$$Y(t) = (1-a). S(t) + a. S(t-\tau). \quad (2)$$

Thus, the circuit again operates as a forward filter. If the blocking electrode is held at the negative voltage and the isolation diffusion 12 is shortened as indicated in FIG. 4, but not shorter than one delay stage in such a way that the blocked charge packet can pass the isolation diffusion upon return and moreover continuous sampling is effected at the input, the charge transfer device of FIG. 4 operates as a recursive filter. In this case the blocked charge packet travels past the isolation diffusion 12 and is then divided again etc. The output signal Y(t) satisfies the relationship $$Y(t) = (1-a). S(t) + a. Y(t-\tau). \quad (3)$$

When for example $a=\frac{1}{2}$ is selected, and one input sample of the value 1 as supplied to the input, the charges $\frac{1}{2}$, $\frac{1}{4}$, $\frac{1}{8}$ etc, will consecutively appear at the output, which may be used as reference charges.

The isolation diffusion 12 may be shortened further or even be dispensed with completely, if the blocking voltage E is selected to have such a positive value that the charge packet underneath the control electrode 81 cannot be transferred any further by the control electrode 8'. In this case the device operates as a filter in conformity with relationship (2).

The examples of charge transfer devices in accordance with the invention given in FIGS. 1 and 4 have the following distinct advantages in comparison with the previously discussed prior art.

In accordance with the invention it is achieved that optionally each control electrode which is connected to a change-over switch can be given two functions, which functions are also optional. The operation to which each charge packet is subjected in the present device can thus be selected by setting the change-over switch to the desired position at suitably selected instants. It is alternatively possible to define the transfer function of the charge transfer device in advance by setting the change-over switch to the desired position in advance.

A further advantage is that the transfer speed of the charge transfer device is hardly affected by the relevant control electrode, because this electrode may have the same dimensions in the direction of transfer as the other control electrodes.

As the dimensions of the control electrodes can be equal, manufacture of the charge transfer device need not be additionally complicated. It is furthermore achieved that certain signal processing operations can be realized by means of such charge transfer devices in accordance with the invention in a simpler, faster, more accurate or less expensive manner than was attainable before.

Figure 5:
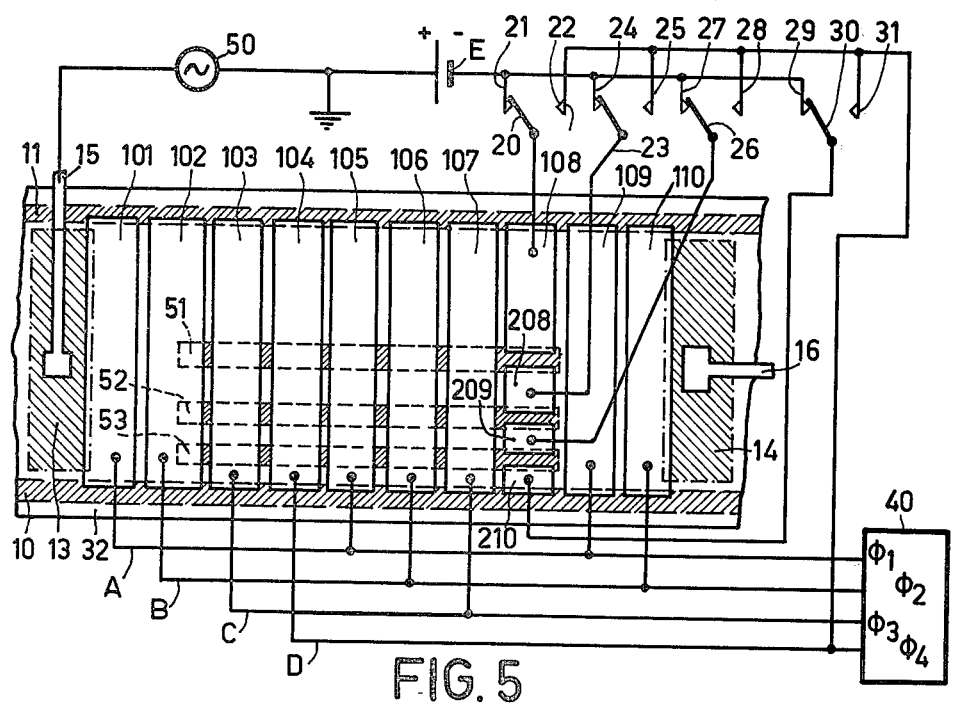
FIG. 5 shows in plan view a further charge transfer device in accordance with the invention.

FIG. 5 shows an example of an application of a charge transfer device in accordance with the invention. With the aid of the device shown analog signals can be multiplied with digital signals. The device comprises control electrodes 101 to 110, 208, 209 and 210. The input diffusion 13 is connected to a point of constant potential by a conductor track 15 and the signal source 50. The control electrodes 101, 105 and 109 are connected to a clock conductor A, which is connected to that output of the switching voltage source 40, to which the clock signal of the phase $\phi_1$ is applied. The control electrodes 102, 106 and 110 are connected to a clock conductor B, which is connected to that output of the switching voltage source 40, to which the clock signal of the phase $\phi_2$ is applied. The control electrodes 103 and 107 are connected to a clock conductor C, which is connected to that output of the switching voltage source 40, to which the clock signal of the phase $\phi_3$ is applied. The control electrode 104 is connected to a clock conductor D, which is connected to that output of the switching voltage source 40 to which the clock signal of the phase $\phi_4$ is applied. The clock conductor D is also connected to contacts 22, 25, 28 and 31 of the respective change-over switches 20, 23, 26 and 30. The other contacts 21, 24, 27 and 29 of the said changeover switches are connected to the negative pole of the direct voltage source E. The positive pole of said direct voltage source is connected to a point at ground potential. The control electrodes 108, 208, 209 and 210 are respectively connected to the master contacts of the change-over switches 20, 23, 26 and 30. Furthermore, the isolation diffusions 51, 52, 53 are formed in the semiconductor body so as to realize the channel division.

The operation of the device in accordance with FIG. 5 is as follows. Alternatively a charge packet which is proportional to the input signal S to be processed and no charge packet are applied to the input (13, 15) in a manner as described hereinbefore with reference to FIG. 4. From the input the said charge packets are divided by the isolation diffusions 51 to 53 into portions which bear a ratio of $1:\frac{1}{2}:\frac{1}{4}:\frac{1}{8}$ to each other, which portions may be blocked or transferred by the respective control electrodes 108, 208, 209 and 210, in a manner as described hereinbefore with reference to FIGS. 1 and 4. The accuracy of the portions mainly depends on the accuracy of the location of the isolation diffusions 51 to 53 and the equality of the threshold voltages underneath the control electrodes.

The charge which passes through the channel section above the isolation diffusion 51 is $\frac{1}{2}$ S = $S_0$. The charge which passes through the channel section between the isolation diffusions 51 and 52 is $\frac{1}{4}$ S = $S_1$. The charge which passes through the channel section between the isolation diffusions 52 and 53 is $\frac{1}{8}$ S = $S_2$. The charge, which passes through the channel section underneath the isolation diffusion 53 is $\frac{1}{8}$ S = $S_3$. On its way from the output 14 of the device each charge packet passes one control electrode, which may operate as a blocking electrode for said charge packet during one clock period, depending on the position of the associated changeover switch 20, 23, 26 or 29. The isolation diffusion is again followed by a common channel, where those charge packets of one input charge packet which have not been blocked, are recombined and constitute one new charge packet $S_4$. One period later all sub-packets, which have been delayed by one clock pulse, are recombined to one charge packet $S_5$ and are transferred to the output in a similar way as $S_4$, but one period later. $S_4$ then first appears at the output:

$$S_4 = k_0.S_0 + k_1.S_1 + k_2.S_2 + k_3 S_3. \tag{4}$$

and $S_5$ then appears one clock period later:

$$S_5 = (1-k_0).S_0 + (1-k_1).S_1 + (1-k_2).S_2 + (1-k_3).S_3 \tag{5}$$

In the two relationships (4) and (5) $k_n$ (n=0,1,2,3) = +1 if the associated charge packet $S_n$ has not been blocked and $k(n) = 0$ if the associated charge packet $S(n)$ has been blocked for one clock period. The charge packets $S_4$ and $S_5$ consecutively reach the output 16 and may be transferred to different external signal lines with the aid of known techniques. However, the charge packets $S_4$ and $S_5$ may also be separated in the charge transfer device itself by, for example, employing two sub-channels which are alternatively opened and closed, which can be realized by the use of a blocking electrode at the input of each sub-channel which is caused to block alternately. Moreover, more or fewer divisions than indicated in the example in accordance with FIG. 5 are possible. Furthermore, the various divisions may be performed after each other, so that the divisions cannot influence each other. Thus, a higher accuracy is obtained. In some cases it is desirable to widen the channel, before the actual division is effected. This can be realized by having the isolation diffusion extend obliquely towards the center of the main channel. The control electrodes, which may operate as blocking electrodes, need not be located at the same distance from the input, as is shown in FIG. 5. When they are for example each located one stage further, series control of the change-over switches 20, 23/26 and 30 is possible. Channel divisions can also be realized in manners other than that shown in FIG. 5, for example by the use of oxide variations or isolation gates. Blocking the charge packets several times after each other is also possible, as well as different input drives.

The charge transfer devices in the present examples are of the type as described in U.S. Patent Application Ser. No. 866,004. It will be evident that the invention may also be applied to other charge transfer devices, as for example described in U.S. Pat. No. 3,918,081 and in Electronics of June 21, 1971, on pages 50 to 59.

Figure 6:
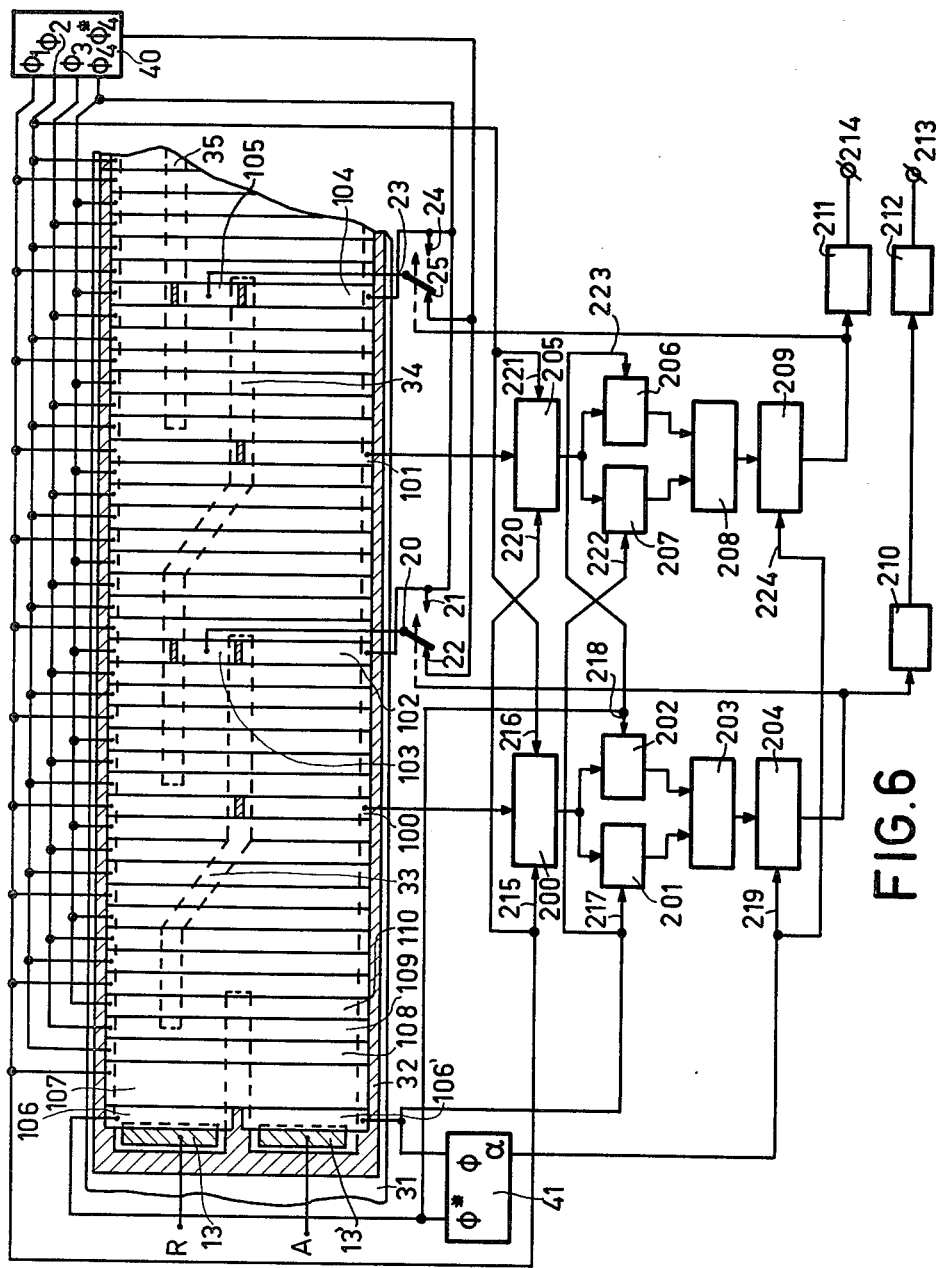
FIG. 6 shows yet another embodiment of a charge transfer device in accordance with the invention.

The charge transfer device of FIG. 6 comprises a semiconductor body with a semiconductor layer 31 of, for example, n-type silicon. On said semiconductor layer, at least on one side of said layer 31, there are arranged a plurality of control electrodes, not all of which are numbered. The control electrode 106' is connected to that output of the switching voltage source 41 at which the clock signal of the phase $\phi$ is available, and the control electrode 106 is connected to that output of the switching voltage source 41 at which the clock signal of the phase $\phi^*$ is available, see FIG. 7. The control electrode 107 and the other control electrodes (without reference numbers) connected thereto are connected to that output of the switching voltage source 40, at which the clock signal of the phase $\phi_1$ is available. The control electrode 108 and the other control electrodes (without reference numbers) connected thereto are connected to that output of the switching voltage source 40, at which the clock signal of the phase $\phi_2$ is available. The control electrode 109 and the other control electrodes (without reference numbers) connected thereto are connected to that output of the switching voltage source 40, at which the clock signal of the phase $\phi_3$ is available. The control electrode 110 and the other control electrodes (without reference numbers) connected thereto are connected to that output of the switching voltage source 40, at which the clock signal of the phase $\phi_4$ is available. The last-mentioned output is also connected to the contact 24 of the change-over switch 23 and the contact 21 of the change-over switch 20. The contacts 22 and 25 of the respective change-over switches 20 and 23 are connected to that output of the switching voltage source 40 at which the clock signal of the phase $\phi^*_4$ is available.

The master contact of the change-over switch 20 is connected to the control electrode 103, while the contact 21 is connected to the control electrode 102. The master contact of the change-over switch 23 is connected to the control electrode 105, while the contact 24 is connected to the control electrode 104.

The control electrode 100 forms a sensing element connected to the input of the detector 200. This sensing element is thus arranged in front of the blocking electrodes 102 and 103. The output of said detector 200 is connected to the input of the sample-and-hold circuit 201 and to the input of the sample-and-hold circuit 202. The outputs of the sample-and-hold circuits 201 and 202 are each connected to an input of a comparator 203, whose output is connected to the input of an edge-triggered flip-flop 204. The output of the edge-triggered flip-flop 204 on the one hand actuates the change-over switch 20 and on the other hand is connected to the input of a delay circuit 210. The output of the delay circuit 210 is connected to point 213 via the delay circuit 212.

The control electrode 101 is arranged in front of the blocking electrode 104 and 105 and also forms a sensing element connected to the input of a detector 205. The output of the detector 205 is connected to the input of the sample-and-hold circuit 206 and the input of the sample-and-hold circuit 207. The outputs of the sample-and-hold circuits 206 and 207 are each connected to an input of a comparator 208, whose output is connected to the input of an edge-triggered flip-flop 209. The output of the edge-triggered flip-flop on the one hand actuates the change-over switch 23 and on the other hand is connected to the input of a delay circuit 211, whose output is connected to point 214.

The control inputs 216 and 221 of the detector circuits 200 and 205 are connected to that output of the switching voltage source 40, at which the clock signal $\phi_2$ is available. The control inputs 215 and 220 of the detector circuits 200 and 205 are connected to that output of the switching voltage source 40 at which the clock signal $\phi_1$ is available. The control input 217 of the sample-and-hold circuit 201 and the control input 222 of the sample-and-hold circuit 207 are connected to that output of the switching voltage source 41 at which the clock signal of the phase $\phi$ is available. The control input 218 of the sample-and-hold circuit 202 and the control input 223 of the sample-and-hold circuit 206 are connected to that output of the switching voltage source 41 at which the clock signal of the phase $\phi^*$ is available. The control input 219 of the edge-triggered flip-flop 204 and the control input 224 of the edge-triggered flip-flop 209 are connected to that output of the switching voltage 141 at which the clock signal is available. In the semiconductor layer 31 there are furthermore arranged the isolation diffusions 32, 33, 34 and 35 in the manner shown. Furthermore, there are arranged the two input diffusions 13 and 13' in said semiconductor layer 31, which are respectively connected to the inputs R and A of the charge transfer device.

For the detectors 200 and 205 circuits known from the literature may be used. For example, a detector of the floating-gate type may be used, as is described in the "Digest of Technical Papers" of the International Solid-State Circuits Conference, February 1976 on pages 194 and 195. The same type of detector is also described in the book "Charge Transfer Devices", Supplement 8, Advances in Electronic and Electron Physics published by Academic Press, New York, page 53, FIG. 3. 14c, page 228, FIG. 6. 15 etc. Furthermore, a detector may be used of the type comprised in a sensing diffusion, as for example described in "Digest of Technical Papers" of the International Solid-State Circuits Conference, February 1974, on pages 156 and 157. Furthermore, a detector of the current-detection type may be employed, as for example described in "Transactions on Electron Devices", Volume ED23, no. 2 on page 265 and further.

For the sample-and-hold circuits 201, 202, 206 and 207 it is possible to use circuits as described in "IEEE Journal of Solid-State Circuits", Volume Sc12, no. 3, June 1977, page 233, FIGS. 4 and 5. As comparator it is possible to use Signetics type LM311, as described in the Data Handbook "Signetics integrated circuits" 1976, in chapter "Analog", pages 192 and 193.

As edge-triggered flip-flop for example Philips type HEF4013B may be used, as described in the Data Handbook "Digital integrated circuits"-"LOCMOS", Sc 6, 10-77, part 6, October 1977.

The operation of the charge transfer device of FIG. 6 will now be described with reference to the time diagram of FIG. 7. To the input diffusion 13' an analog signal A is applied, while a reference signal is applied to the input diffusion 13. It is now assumed that at a specific instant by means of said diffusions respective charge packets A(n) and R(n) are applied to the charge transfer device under command of the respective signals $\phi$ and $\phi^x$. After injection at the input of the device the charge packet R(n) is divided into two subpackets by the channel isolator 33. The subpacket situated above the channel isolator 33 shown in FIG. 6 continues its way through the charge transfer device and is subsequently divided again by the channel isolator 34 etc. The subpacket situated underneath the channel isolator 33 (shown in FIG. 6) arrives in the lower channel and at the instant $t_o$ it is situated underneath the control electrode 100 and is then detected by the detector 200. The signal at the output of the detector is sampled by the sample-and-hold circuit 201 and is held from the instant $t'_o$. With the aid of the detector circuit 200 under command of the control input 216 of said detector circuit the control electrode is brought at a voltage level at the instant $t''_o$, which voltage level is equal to the voltage at the input 215 of said detector circuit 200. At the instant $t_1$ the charge packet A(n), which has previously been injected into the charge transfer device with the aid of the input diffusion 13', is situated underneath the control electrode 100 and is detected with the aid of the detector 200. The signal appearing at the output of the detector 200 is sampled by the sample-and-hold circuit 202 at $t_1$ and is held from the instant $t'_1$. At the instant $t''_1$ the control electrode is brought at a voltage level which is equal to the voltage at the input 215 of the detector circuit 200 under command of the control input 216 of said detector circuit 200. The signal values appearing at the outputs of the two sample-and-hold circuits 201 and 202 are now compared with each other in the comparator 203. When the charge packet $A(n) > \frac{1}{2}R(n)$ a logic 1 will appear at the output of the comparator and when the charge packet $A(n)$ is smaller than the charge packet $\frac{1}{2} R(n)$ a logic 0 will appear at the output of the comparator 203. This output defines the value of the first bit.

At the instant $t_2$ the value of the logic signal appearing at the output of the comparator 203 is taken over by the edge-triggered flip-flop 204 on the positive edge of the control signal. The edge-triggered flip-flop 204 transfers this value of the logic signal to a delay section 210, which together with the subsequent delay section 212 ensures that the logic signal supplied to the output of the edge-triggered flip-flop 204 appears at point 213 if the logic signal supplied by the edge-triggered flip-flop 209, which signal also belongs to the charge packet $A(n)$, appears on point 214. Moreover, the logic output signal of the edge-triggered flip-flop 204 is employed to control the change-over switch 20. When the output signal of the edge-triggered flip-flop 204 is a logic 1, contact 20 is connected to contact 21. When the output signal of the edge-triggered flip-flop 204 is a logic 0, the contact 20 is connected to the contact 22. In the drawing of the diagrams of FIG. 2, it has been assumed that the charge packet $A(n)$ is smaller than the charge packet $\frac{1}{2} R(n)$. At the instant $t_3$ a charge packet $\frac{1}{4} R(n)$ is blocked by the control electrode 103, because the master contact of the change-over switch 20 is connected to the contact 20. It is not until the instant $t_4$ that said charge packet can pass underneath the control electrode 103 so as to be further transferred through the charge transfer device. Underneath the control electrode adjoining the control electrode 103 the charge packets $A(n)$ and $\frac{1}{4} R(n)$ meet and are added to each other. The reference charge packet $\frac{1}{2} R(n)$ is situated underneath the control electrode 101 at the instant $t_6$ and is detected with the aid of the detector 205. The signal appearing at the output of the detector 205 is sampled by the sample-and-hold circuit 207 under command of the input 222 and is held from the instant $t'_6$. At the instant $t''_6$ the control electrode 101 is brought at a voltage level on command of the control input 221 of the detector circuit 205, which level is equal to the voltage at the input 220 of the detector 205.

At the instant $t_7$ the charge packet of the magnitude $\frac{1}{4} R(n) + A(n)$ arrives underneath the control electrode 101 and is then detected by the detector 205. The signal appearing at the output of the detector 205 is sampled by the sample-and-hold circuit 206 under command of the input 223 and is held from the instant $t'_7$. At the instant $t''_7$ the control electrode 101 is brought at a voltage level equal to the voltage at the input 220 of the detector 205 under command of the control input 221 of the detector circuit 205. In the comparator 208 the signal values appearing at the two inputs are compared. When the charge packet ($\frac{1}{4} R(n) + A(n)$) is greater than the reference charge packet $\frac{1}{2} R(n)$ a logic 1 will appear at the output of the comparator, and if the charge packet ($\frac{1}{4} R(n) + A(n)$) is smaller than the reference charge-packet a logic 0 will appear at the output of the comparator 208. AAt the instant $t_8$ the value of the logic signal appearing at the output of the comparator 208 is taken over by the edge-triggered flip-flop 209 on the positive edge of the control signal. The edge-triggered flip-flop 209 transfers the value of said logic signal, which represents the second bit, to the delay section 211. Moreover, the logic output signal of the edge-triggered flip-flop 209 is used for controlling the change-over switch 23. When the output signal of the edge-triggered flip-flop 209 is a logic 1, the master contact of the change-over switch 23 is connected to the contact 24. If the output signal of the edge-triggered flip-flop 209 is a logic 0, the master contact of the change-over switch 23 is connected to the contact 25.

Figure 7:
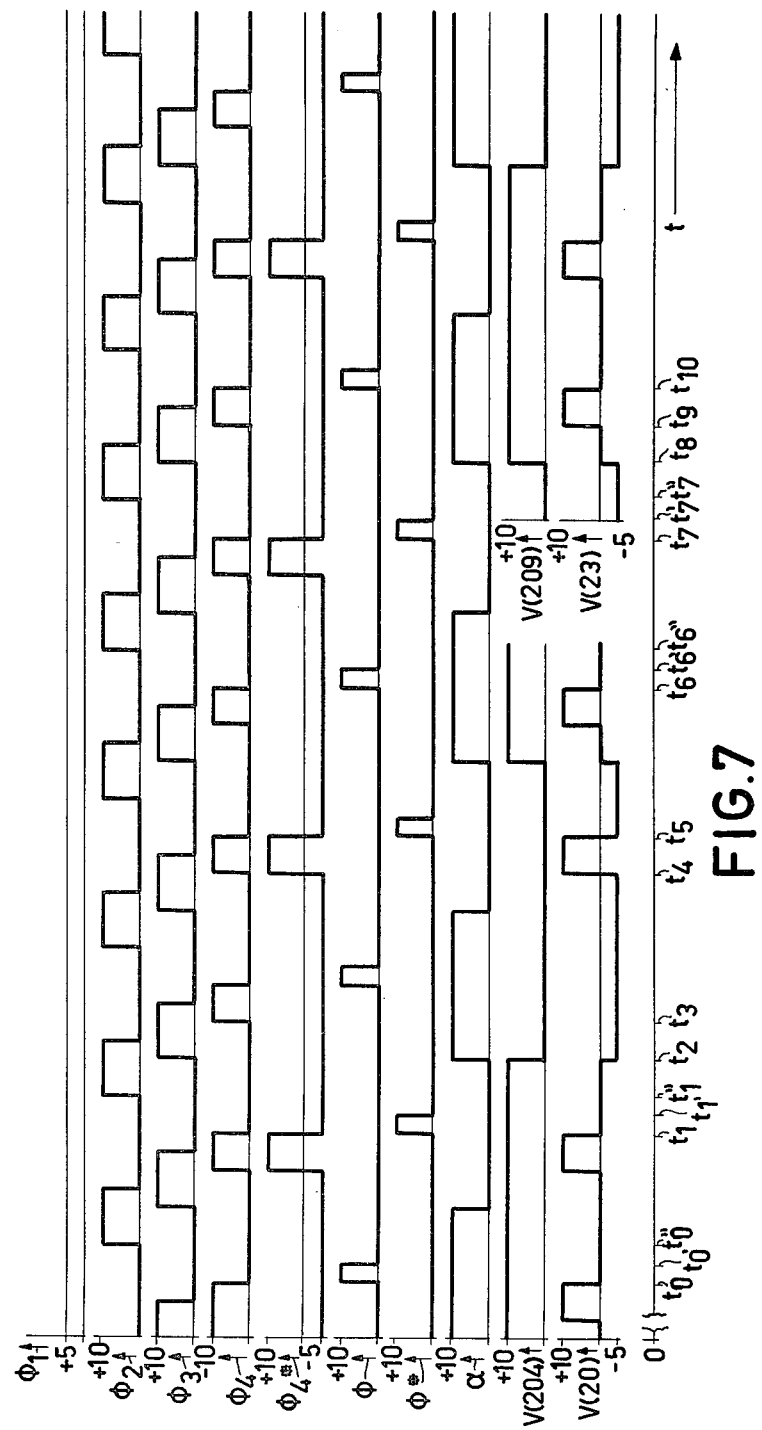
FIG. 7 represents the voltages as a function of time for the device of FIG. 6 and FIGS. 8a to 8d illustrate different forms of the device of FIG. 6.

In drawing up the diagrams of FIG. 7 it has been assumed that the charge packet ($A(n) + \frac{1}{4}R(n)$) is greater than the reference charge-packet $\frac{1}{2} R(n)$. At the instant $t_9$ the charge packet $\frac{1}{8} R(n)$ is situated underneath the control electrode 105, after which at the instant $t_{10}$ it arrives underneath the adjoining control electrode simultaneously with the reference charge-packet $\frac{1}{2} R(n)$. These two packets are added to each other, yielding the packet $\frac{5}{8} R(n)$.

The charge transfer device may be further extended in a similar way as described hereinbefore for the first two sections. The following equation will then be valid:

$$A(n) + \frac{1}{4}R(n) > < \frac{5}{8}R(n) \tag{6}$$

In the foregoing description one charge packet $A(n)$ of the input signal A and the associated reference charge packet $R(n)$ has been traced. However, charge packets are continually being injected at the input of the charge transfer device under command of the switching signals $\phi$ and $\phi^{-x}$, see FIG. 7. Thus, the detector 200, after it has detected the packets $\frac{1}{2} R(n)$ and $A(n)$, will consecutively detect the packets $\frac{1}{2} R(n+1)$ and $A(n+1)$ etc. In the diagrams of FIG. 7 it has been assumed that $$\frac{1}{2}R(n-l) + \frac{1}{4}R(n-l)\frac{1}{2}R(n+l) < A(n+1) < \frac{1}{2}R(n+l) \tag{7}$$

In the example of the charge transfer device of FIG. 6 a possible method of integration is shown. This is again shown schematically in FIG. 8a. The reference numerals in this Figure correspond to the reference numerals of the embodiment of FIG. 6. However, other methods of integration are also possible. In FIGS. 8b, 8c and 8d three possible methods of integration are shown. In the example of FIG. 8b the distance between the isolation diffusions, which act as dividers, has been increased. On the one hand this has the advantage that in the logitudinal direction of the charge transfer devive there are more possibilities in respect of the location of the blocking electrode and on the other hand that the influence of the blocking electrode on the division is reduced. The example of FIG. 8c has the advantage that the potential wells for the divider can all be filled to substantially the same level. As a result of this faults in the potential wells, for example, threshold differences are reduced. Moreover, lateral charge transfer will never be possible, so that the rate of transfer of the charge transfer device can be improved. In the example of FIG. 8d the charge packets are kept isolated, so that they may be re-used at the output of the charge transfer device. Thus, a choice can be made from the quantized signal and/or the analog signal.

In the embodiment given in FIG. 6 the reference charge and the signal charge are detected by the same sensing electrode. However, it is alternatively possible to detect the two charge packets with the aid of different sensing elements, so that the sample-and-hold circuits may be dispensed with. Furthermore, it is to be noted that channel isolations can also be realized in manners other than indicated, for example by employing ion implantation or by the use of oxide variations. Furthermore, both poly and aluminium electrodes may be employed for the control electrodes.

The charge transfer devices in the examples are of the type as described in U.S. Pat. Application Ser. No. 866,004 filed Dec. 30, 1977. It will be evident that the steps in accordance with the invention may also be applied to other charge transfer devices, as is for example described in U.S. Pat. No. 3,918,081 and for example in "Electronics"; June 21, 1971 on pages 50 through 59.

The charge transfer device may also be used as a multiplying analog-to-digital converter. Furthermore, if an accurate division is required, the control electrode above the beginning of the channel isolator may be dimensioned differently, it may for example be widened. Moreover, the analog signal may also be coded in a different manner by means of the charge transfer device, for example using the Cray code. For this purpose, inverter circuits may be disposed after the comparators, the control input of such an inverter circuit being connected to the output of the preceding trigger circuit, which can turn on or off the inverter circuit.

What is claimed is:

1. A charge transfer device having a switchable blocking electrode comprising:
   a semiconductor layer of one conductivity type;
   means for permitting information in the form of packets of charge to be locally introduced into said semiconductor layer;
   read means for permitting the information to be read at another location in said layer;
   control electrodes at least on one side of said layer;
   said control electrodes connected to clock lines such that two adjacent electrodes are connected to different clock lines;
   said clock lines connected to a clock pulse generator for delivering multiphase clock signals by means of which electrical fields are capacitively generated in said semiconductor layer, with which fields the charge packets can be transferred to said read means along a channel in said layer in a direction parallel to said layer;
   at least one of said control electrodes being divided into two or more parts in a direction perpendicular to the direction of charge transfer;
   switching means present between at least one of said control electrodes or a divided part thereof and the respective clock line for permitting the application of a voltage which at one time is equal to a phase of the clock signal which together with the clock voltages on adjacent control electrodes ensures the transfer of a charge packet in the channel underneath said at least one control electrode and at another time is equal to a blocking voltage which prevents the transfer of a charge packet in the channel underneath said at least one control electrode;
   said switching means being constituted by a change-over switch having a master contact connected to said at least one control electrode, one contact connected to a terminal for the application of a blocking voltage and another contact connected to a clock conductor to which said at least one control electrode would be connected in the absence of the change-over switch;
   means for splitting the transfer channel into as many channel sections as there are parts into which said at least one control electrode is divided, each of the parts of said control electrode functioning as a control electrode for the channel section underneath it;
   said means for splitting the transfer channel comprising isolation diffusions each of which is located below the area between two adjacent parts of the divided control electrode, each of said parts partly overlapping the relevant isolation diffusion, and the isolation diffusions extending substantially in the direction of charge transfer;
   at least one sensing element arranged in front of the blocking electrode in the direction of the charge transfer and associated with the same channel as said blocking electrode, which sensing element is connected to a detector connected directly or indirectly to a comparator for comparing the magnitude of the signal appearing at the output of the detector with a reference signal, the output signal of the comparator being applied to a control input of said switching means either through or not through delay elements.

2. A charge transfer device as claimed in claim 1, including two input diffusions isolated by an isolation diffusion at the input of the charge transfer device, a reference signal being applied to one of the input diffusions and the signal to be processed being applied to the other input diffusion, so that in the charge transfer device, reference charge packets and signal charge packets are formed, and a second isolation diffusion is provided in the channel in which the reference charge packets are transferred for dividing the reference charge packets, which second isolation diffusion at least extends to the blocking electrode, the same sensing element serving to sense successively the reference signal and the signal to be processed.

3. A charge transfer device as claimed in claim 2, wherein one of the reference charge packets divided by said second isolation diffusion is divided again with the aid of a further isolation diffusion, which extends past a second sensing element and to a second blocking electrode.

4. A charge transfer device as claimed in claim 3, wherein the control inputs of the switching means associated with the one blocking electrode and with the second blocking electrode are each connected to an output of the charge transfer device by a delay circuit.

* * * * *